(12) United States Patent
Blackburn et al.

(10) Patent No.: US 9,088,267 B2
(45) Date of Patent: Jul. 21, 2015

(54) SYSTEM LEVEL POWER DELIVERY TO A PLASMA PROCESSING LOAD

(75) Inventors: Thomas Joel Blackburn, Fort Collins, CO (US); Thomas McIntyre, Fort Collins, CO (US); Fernando Gustavo Tomasel, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 804 days.

(21) Appl. No.: 13/343,576

(22) Filed: Jan. 4, 2012

(65) Prior Publication Data
US 2013/0002136 A1    Jan. 3, 2013

Related U.S. Application Data

(60) Provisional application No. 61/429,472, filed on Jan. 4, 2011.

(51) Int. Cl.
*H01J 7/24* (2006.01)
*H05B 31/26* (2006.01)
*H03H 7/40* (2006.01)
*H01J 37/32* (2006.01)
*H05H 1/46* (2006.01)

(52) U.S. Cl.
CPC ............ *H03H 7/40* (2013.01); *H01J 37/32183* (2013.01); *H05H 2001/4682* (2013.01)

(58) Field of Classification Search
None
See application file for complete search history.

(56) References Cited

U.S. PATENT DOCUMENTS

| | | | | |
|---|---|---|---|---|
| 5,936,481 | A | * | 8/1999 | Fujii ............................ 333/17.3 |
| 8,040,068 | B2 | * | 10/2011 | Coumou et al. ......... 315/111.21 |
| 8,264,154 | B2 | | 9/2012 | Banner et al. |
| 2007/0121267 | A1 | * | 5/2007 | Kotani et al. ................... 361/85 |
| 2007/0139122 | A1 | * | 6/2007 | Nagarkatti et al. ........... 330/302 |

FOREIGN PATENT DOCUMENTS

WO    WO 2007139122 A1    12/2007

OTHER PUBLICATIONS

Mitrovic, Bayer, "International Search Report and Written Opinion re Application No. PCT/US12/20219", Feb. 22, 2012, p. 10 Published in: AU.
Becamel, Philippe, "International Preliminary Report on Patentability re Application No. PCT/US2012/020219", Jul. 18, 2013, p. 7 Published in: CH.
Hayashi, Yasushi, "Japanese Office Action re Application No. 2013-547731", Sep. 30, 2014, p. 8 Published in: JP.

* cited by examiner

*Primary Examiner* — Anh Tran
(74) *Attorney, Agent, or Firm* — Neugeboren O'Dowd PC

(57) ABSTRACT

The present disclosure discusses a power delivery system, and methods of operation, configured to monitor characteristics of a generator, a match network, and a plasma load, via one or more sensors, and control these components via a local controller in order to improve power delivery accuracy and consistency to the plasma load. Control can be based on a unified monitoring of power characteristics in the power delivery system as well as variations between components and even non-electrical characteristics such as plasma density, end point, and spectral components of plasma light emission, to name a few.

21 Claims, 9 Drawing Sheets

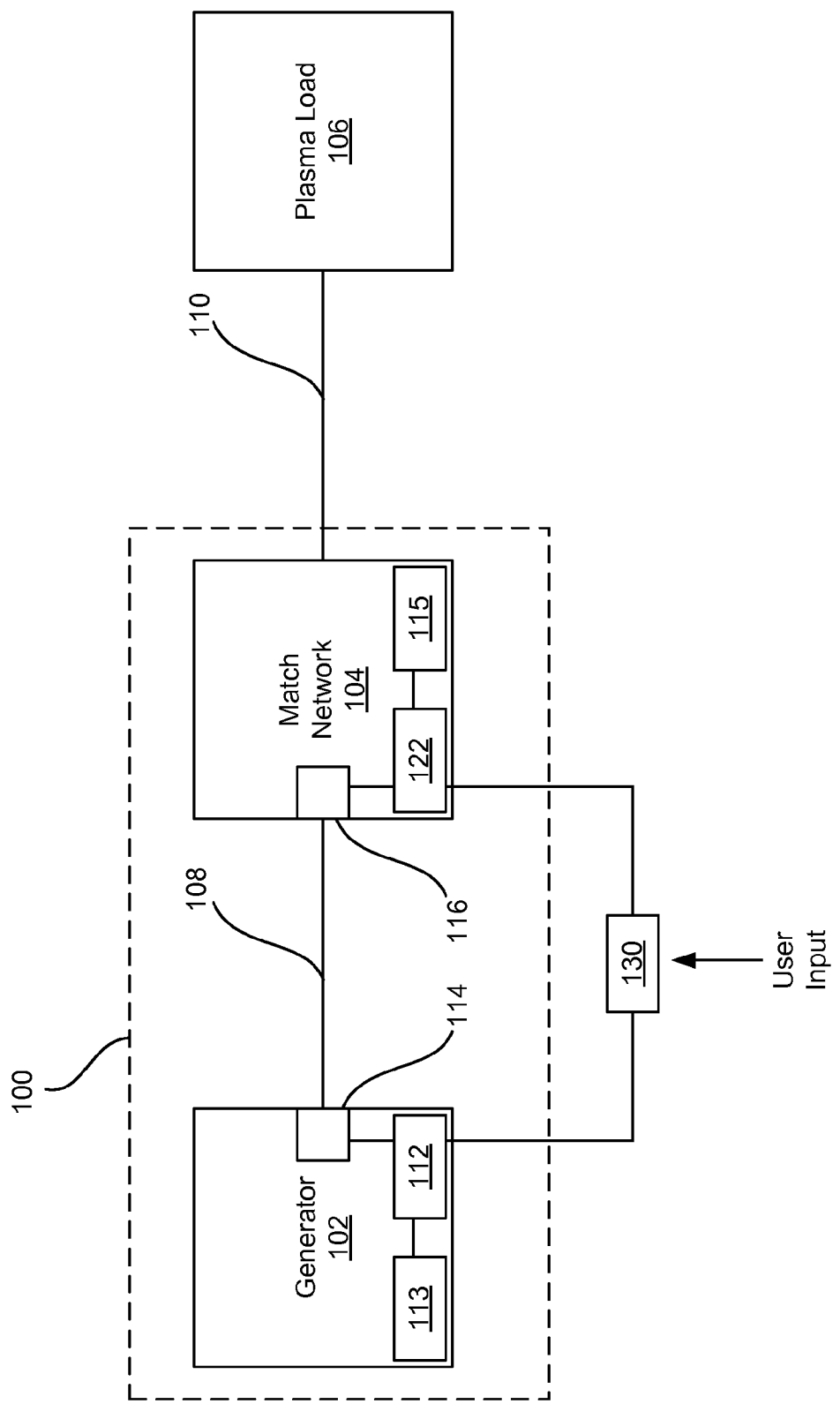

SYSTEM LEVEL POWER DELIVERY TO A PLASMA PROCESSING LOAD

PRIORITY AND CROSS REFERENCE TO RELATED APPLICATIONS

This application claims the benefit of Provisional U.S. Patent Application No. 61/429,472 filed on Jan. 4, 2011. The details of Application No. 61/429,472 are incorporated by reference into the present application in their entirety and for all proper purposes.

FIELD OF THE INVENTION

This invention relates to maintaining consistent power delivery to a plasma processing load. More particularly it relates to systems level unification of generator(s), match network(s), sensors, and the monitoring and control of the same.

BACKGROUND OF THE INVENTION

The continued drive for ever shrinking features in semiconductor manufacturing poses significant challenges for tool manufacturers and process developers alike. Requirements such as higher uniformity, tighter control of critical dimensions, reduced plasma damage, thinner layers, and shorter process times, combined with the introduction of new materials demand higher sophistication in the development of semiconductor processing tools. These requirements apply at the plasma chambers and go all the way down to the power delivery systems.

A human operator typically monitors multiple sensor outputs from a generator and a match network and adjusts numerous parameters in an imperfect and relatively slow attempt to maintain consistent power delivery to the plasma load. The operator may interact with an external controller that collects information from the various components of the system, displays this information for the operator, and transmits commands from the operator to the various components of the system. Although this configuration has worked in the past, it is increasingly apparent that it may not be adequate for current systems.

As an example, major advances in etch processes have been enabled by the introduction of a recent generation of RF power supplies with advanced capabilities, including generator frequency tuning while pulsing and multi-generator synchronized pulsing. Yet, even this cutting edge power delivery system is still being held back since the system components act independently and are therefore controlled independently. In particular, while the generator provides pulsed power with a tunable frequency, the match network has difficulty detecting, measuring, and responding to the pulsed signal and thus has difficulty taking advantage of the generator's capabilities. Operators tend to select an optimal variable capacitor position inside the match network and then run the process—a suboptimal solution for minimizing real time power reflection. So, while significant improvements have been made in plasma processing power supplies, they continue to be held back by the independent control of the generator and match network.

FIG. 1 illustrates a generator, match network, and plasma load well known to those of skill in the art. The generator 102 provides power to the plasma load 106 via the match network 104, where the match network 104 can alter an internal impedance such that as the impedance of the load 106 changes, an impedance seen by the generator 102 remains substantially constant (e.g., 50Ω). The match network 104 typically includes a sensor 116 that measures power incident upon the match network 104 and power reflected from the match network 104 back to the generator 102, and then uses these values to calculate an impedance of the plasma load 106. The generator 102 often includes a sensor 114 that measures power output of the generator 102. The sensors 114, 116 communicate their measurements to a user, sometimes via an external user interface 130. The user then instructs the match network 104 and/or the generator 102 to adjust in an attempt to tune the system.

In particular, the generator 102 can be instructed to produce a particular electrical characteristic (e.g., power or frequency) or a desired power delivered to the plasma load 106 can be selected and the generator 102 can tune to achieve that power. Similarly, the match network 104 can be instructed to operate at a particular impedance or can be instructed to tune in order to achieve a desired reflected power. In some cases, the generator 102 and the match network 104 can both be instructed to tune in order to meet desired power output characteristics.

The generator 102 sometimes includes a communications and logic board 112 that facilitates communication between the sensor 114, a radio frequency (RF) engine 113, and the user interface 130. The RF engine 113 can generate RF power and control the amplitude and waveform of the power generated by the generator 102. Similarly, the match network 104 sometimes includes a communications and logic board 122 that facilitates communications between the sensor 116, an impedance control system 115, and the user interface 130. The impedance control system 115 can control the impedance of the match network 104, for instance by having a motor drive board adjust variable capacitors of the match network 104.

This power delivery system 100 can be slow to adjust to changes in the plasma load 106 and dynamic power profiles from the generator 102 (power accuracy or consistency). For instance, there is a delay between the moment of measurement by either sensor 114, 116 and the moment when the measured values reach the user interface 130. There is also a delay when instructions are sent back to the generator 102 and the match network 104.

As for accuracy, the sensor 116 of the match network 104 only samples after a threshold current or voltage has been detected, and therefore is not sampling while the power is being compared to the threshold. A smaller sample size and the inability to sample from the start of pulsing leads to less accurate impedance measurements. Also, despite calibrating each sensor 114, 116, the sensors 114, 116 still have some level of error, and thus when used in combination, the net effect has an error roughly equivalent to the sum of the error of the individual sensors 114, 116. Finally, impedance measurements are most accurately taken when the frequency of power being measured is known. Since the sensor 116 of the match network 106 has to measure the frequency of power reaching the match network 104, and this measurement typically has some degree of error, the impedance calculated based on the sensor's 116 measurements typically also has some corresponding degree of error. As seen, speed and accuracy are limited in traditional systems resembling that of FIG. 1.

Quality may also be hampered in the art since the power delivery system 100's inaccuracy and slow speed can lead to inconsistent power delivery. In some cases, multiple generators feed power to a single plasma load via multiple match networks. Power quality is a particular issue in these cases since each generator and match network not only have to account for the plasma load, but also for the other generators, which are visible to each other. In other words, the impedance matching challenge is increased where multiple generators are involved, and thus power quality is further degraded when multiple generators are used.

While the system of FIG. 1 may have been adequate in the past, it may not be adequate to provide quickly adjusting, accurate, and consistent power to nonlinear, dynamic plasma loads characteristic of new processes with more stringent requirements of accuracy and stability and short processing steps.

SUMMARY OF THE INVENTION

The present disclosure discusses a power delivery system, and methods of operation, configured to monitor characteristics of a generator, a match network, and a plasma load, via one or more sensors, and control these components via a local controller in order to improve power delivery accuracy and consistency to the plasma load.

One aspect of the disclosure can be characterized as a power delivery system. The power delivery system can include a generator, a match network, a first sensor, and a local controller. The generator can be configured to provide power to a plasma load. The match network can be configured to impedance match an output of the generator to the plasma load. The first sensor can be configured to measure voltage, current, phase, impedance, and/or power of the power at an output of the generator, and configured to generate a corresponding measured voltage, current, phase, impedance, and/or power. The local controller can be configured to: receive the measured voltage, current, phase, impedance, and/or power from the sensor; receive a user power delivery requirement; analyze the measured voltage, current, phase, impedance, and/or power as well as the user power delivery requirement; and instruct the generator and/or match network to adjust one or more operating parameters in order to meet the user power delivery requirements.

Another aspect of the disclosure can be characterized as a method including monitoring, analyzing, and relaying operations. In particular, the method can include monitoring electrical characteristics of a power output of a generator and providing the electrical characteristics of the power output to a local controller. The method can also include analyzing the electrical characteristics of the power output. The method can further include relaying instructions to the generator and the match network, based on the analyzing, thereby enabling simultaneous tuning of the generator and the match network.

Yet another aspect of the disclosure can be characterized as a power control system of a power delivery system. The power control system can include a first sensor and a local controller. The first sensor can be configured to monitor power output of a generator and impedance seen by the generator. The generator can be configured to provide power to a plasma load via a match network. The local controller can be in communication with the first sensor and configured to manage tuning of the generator and the match network. The tuning accounts for the power output of the generator and the impedance seen by the generator

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

FIG. 1 illustrates a generator, match network, and plasma load well known to those of skill in the art.

DETAILED DESCRIPTION

This disclosure overcomes the challenges faced in the prior art by recognizing that traditional and even cutting edge systems are still limited by their autonomous design—in particular, a generator and match network independently operated. This disclosure describes systems, methods, and apparatuses for integrating communication, measurement, and control amongst components of a power delivery system (also known as a power generation and delivery system). Some advantages of this approach include the ability to provide accurate power regulation over a wide dynamic range, faster power stabilization during transients, and decreased reflected power, for both pulsed and continuous wave (CW) power.

Figure 2A:
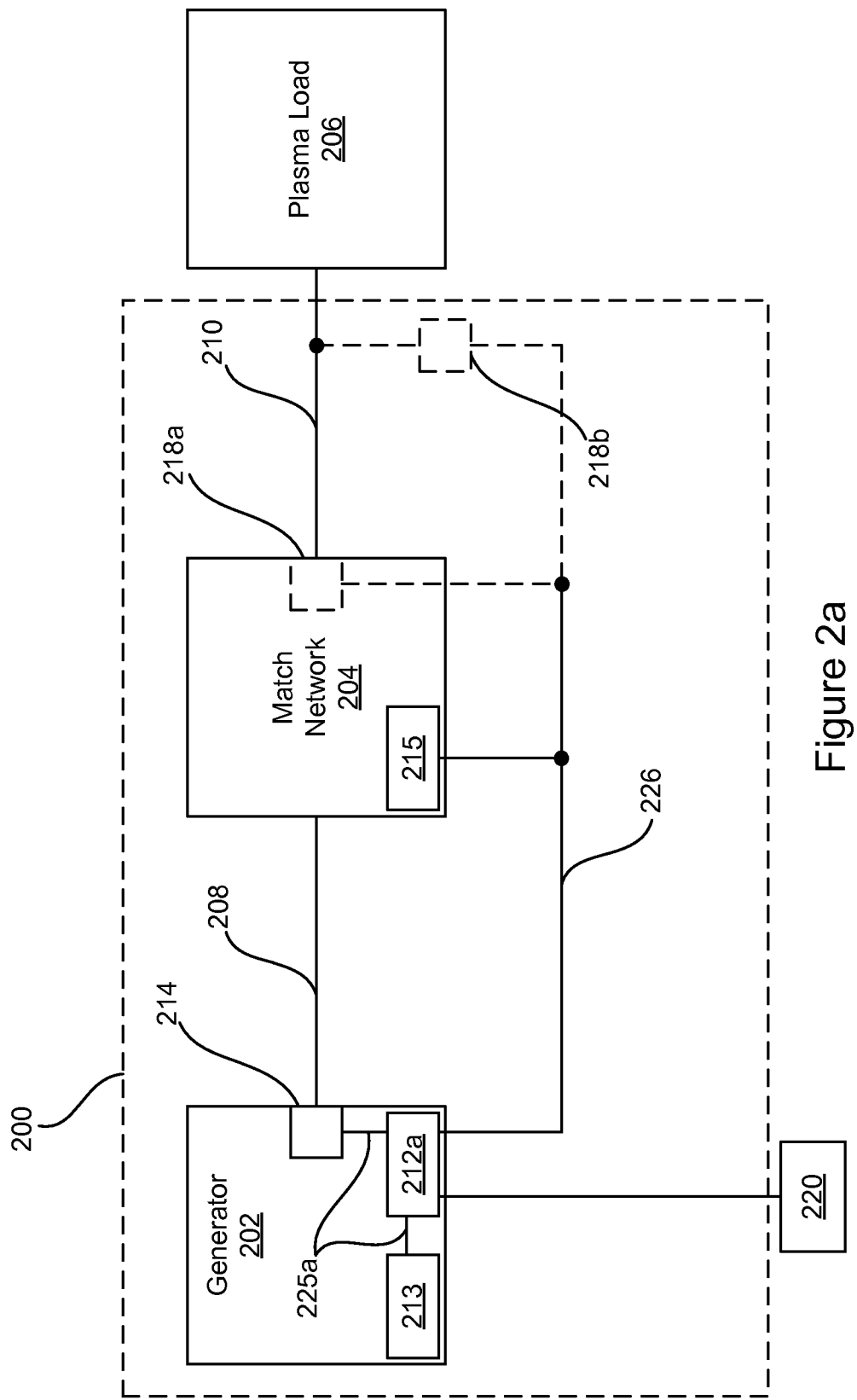
FIGS. 2a-2c illustrate embodiments of a power delivery system including a generator providing power to a match network.
Figure 2B:
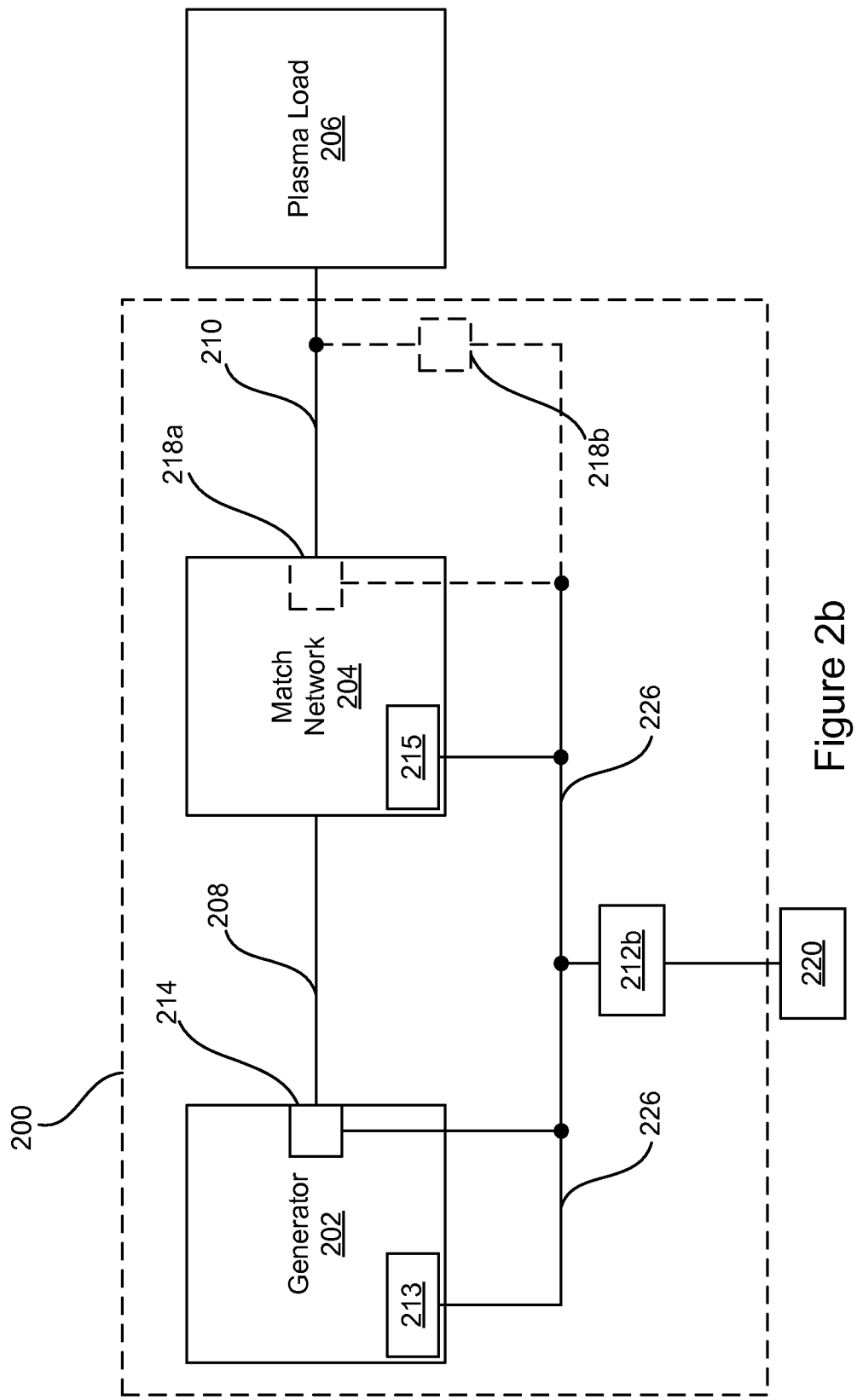
Figure 2C:
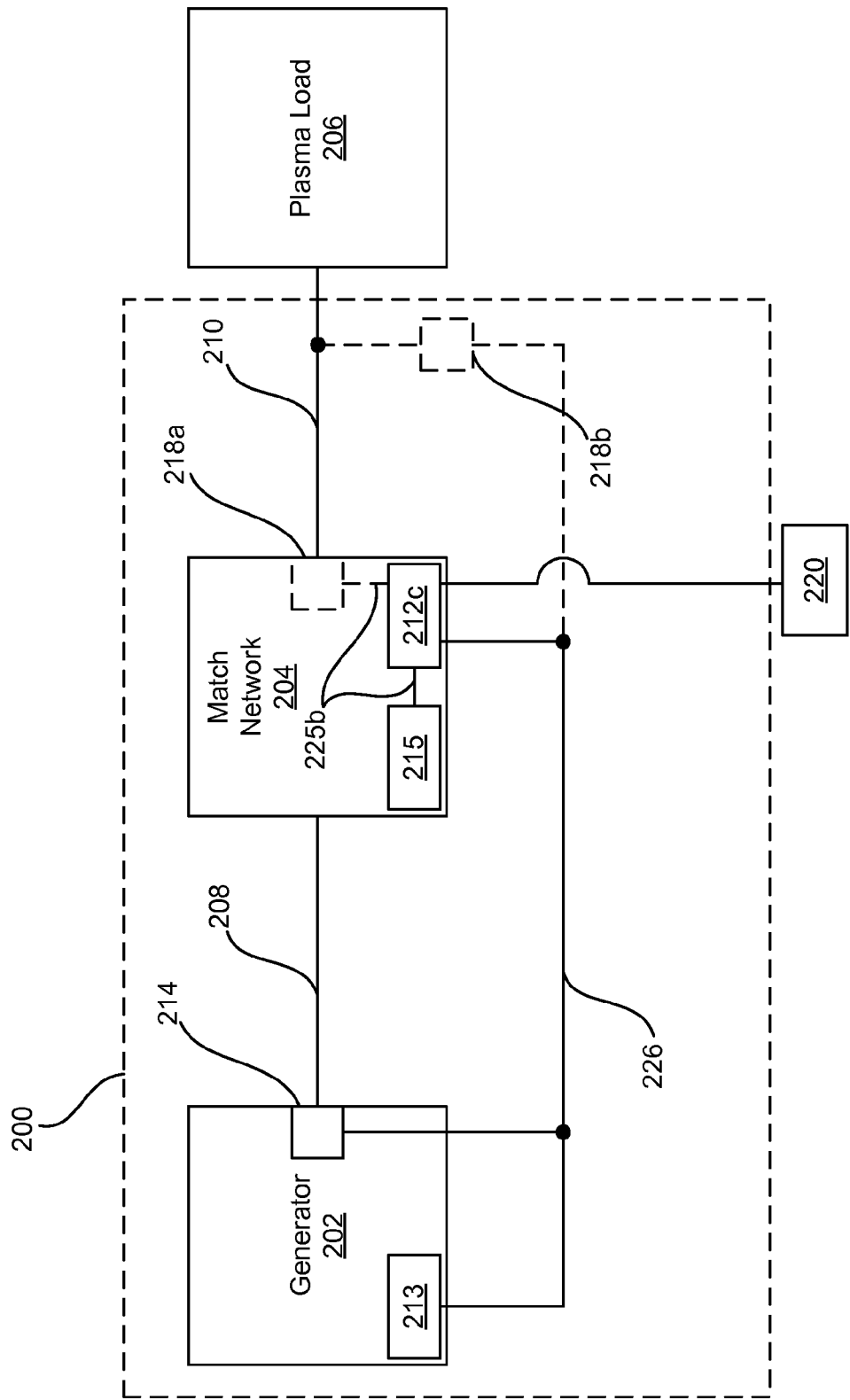

FIGS. 2a-2c illustrate three embodiments of a power delivery system 200. The power delivery system 200 provides power to a plasma load 206, where a match network 204 minimizes reflected power. A generator 202 power output is provided to the match network 204 via a first transmission medium 208 and then on to the plasma load 206 via a second transmission medium 210. A first sensor 214 and an optional second sensor 218 monitor electrical characteristics of the power by measuring one or more of voltage, current, phase, impedance, and power and pass (or relay) this information to a local controller. The local controller 212 resides in either the generator 202 or the match network 204 (see FIG. 2b), or anywhere within the power delivery system 200 (see FIG. 2c), and manages communication between the generator 202, the match network 204, and one or more of the sensors 214, 218. The local controller 212 can also manage communication between a user and any components of the power delivery system 200. The local controller 212 can manage the power delivery system 200 so that rapidly-adjustable, constant, and accurate power is delivered to the plasma load 206 according to one or more power delivery requirements.

The one or more sensors 214, 218 monitor the power for the local controller 212. In particular, the first sensor 214 can monitor a power output of the generator 202 as well as an impedance seen by the generator 202. The local controller 212 analyzes measurements provided by the first sensor 214 (and optionally also the second sensor 218) in light of the power delivery requirements. It can determine operating parameters for the generator 202 and match network 204 judged sufficient to meet the power delivery requirements, and can instruct (or relay instructions to) the generator 202 and the match network 204 to adjust internal parameters of those components in order to meet the power delivery requirements.

This unified power delivery system 200, or the herein disclosed use of a local controller 212 in conjunction with the first sensor 212 (and optionally the second sensor 218), has a number of advantages over the prior art. First, by unifying control and operation of various components of the power delivery system 200, novel power delivery methods are enabled, such as the ability to simultaneously tune the match network 204 and the generator 202 or tune the match network 204 while pulsing or changing the waveform of the generator 202 output. Second, this system and approach enables rapidly-adjustable, accurate, and consistent power delivery to the plasma load 206. The speed of the power delivery system 200 is particularly useful in dynamic power applications (e.g., pulsed generator 202 output).

The ability to more rapidly adjust power delivery can in part be attributed to avoidance of delays that traditional systems see when sensors must first measure frequency before measuring impedance. The local controller 214 provides the first sensor 214 with operating parameters of the generator, such as frequency, so that the first sensor 214 need not measure frequency before beginning to sample for impedance. Earlier sampling means that impedance can be determined faster than in the art. The local controller 214 can also provide the first sensor 214 with an indication of the start of pulsing or a change in a power waveform, thus preventing the first sensor 214 from having to detect such a change before sampling begins. This also enables the first sensor 214 to begin measuring impedance sooner than sensors in the art.

The power delivery system 200 also improves the accuracy of power delivery in four ways. First, when multiple sensors are used to measure power and impedance (e.g., 114 and 116, respectively) each sensor has an error function associated with that sensor resulting from calibrations that are made to each sensor. By using a single sensor 214 to measure power and impedance, only a single calibration is performed, and therefore less error is introduced.

Second, having a greater number of sampling points can improve impedance measurements. In the art, sampling typically can only begin after a pulse or change in the generator waveform has been detected, whereas here, the local controller 212 indicates to the first sensor 214 a start of a pulse or change in the generator 202 waveform before or when the pulse or waveform change occurs. As such, the first sensor 214 can begin sampling earlier than is possible in the art, thus enabling more accurate impedance measurements.

Third, a measure of impedance depends on the frequency of the signal being measured, and thus errors in measuring frequency translate to errors in the impedance that is measured. Prior art impedance measurements are often made after a sensor (e.g., 116) in the match network measures frequency, thus introducing unnecessary error. Alternatively, when using a broadband sensor, error is introduced by analog variation in the broadband sensor as a function of frequency. By making the first sensor 214 aware of the frequency that the generator 202 is producing, rather than requiring the first sensor 214 to measure the frequency at the match network (e.g., 104), the first sensor 214 sees less error in impedance measurements than sensors in the prior art. Also, because the first sensor 214 does not have to measure frequency, it can take more samples, and a larger sample size improves accuracy.

Fourth, since every component (e.g., generator 202, first sensor 214, match network 204, optional second sensor 218) in a power delivery system is different, operating parameters of a power delivery system are preferably adjusted when different components are substituted. Traditional power supplies do not account for variations between components. In contrast, the local controller 212 is aware of the various components of the power delivery system 200 and adjusts its instructions to the generator 202 and the match network 204 accordingly.

Component variations can be taken into account by identification of the components to the local controller 212. For instance, the generator 202 and match network 204 can identify themselves to the local controller 212 via brand, model, serial number or other identifying information. Also, they can provide operating characteristics such as status, set point, and configuration, to name a few. This can be done via the RF engine 213 and the impedance control system 215, respectively. The first and second sensors 214, 218 can also identify themselves to the local controller 212. Authentication may take place via an authentication algorithm. As such, in one embodiment, only specific types or brands of generator 202 and match network 204 are operable when connected via the transmission medium 208. The local controller 212 can also query the generator 202, the match network 204, and the sensors 214, 218 to determine their unit type, serial number, part number, or any other identifying information. With this knowledge, the local controller 212 can tailor instructions to the generator 202 and the match network 204 to account for variations in components, thus allowing the power delivery system 200 to provide more accurate and consistent power than is possible in the art.

The power delivery system 100 also improves the consistency (or quality) of power delivery because of the ability to measure both power and impedance. In part, consistency is improved via the greater accuracy described above (e.g., decreased error stack-up and earlier and more extensive sampling). Consistency is also improved, because, where the prior art had difficulty maintaining stability in multiple control loops of a power delivery system, the single controller 214 can control the multiple control loops and ensure stability and synchronization between the control loops.

A number of design aspects enable these advantages. First is the use of a single sensor 214 to monitor both power output of the generator 202 and an impedance seen by the generator 202. The first sensor 214 can measure voltage, current, phase, impedance, and power at an output of the generator 202. The first sensor 214 can be arranged at an output of the generator 202. The first sensor 214 can measure impedance seen by the generator 202 in addition to power from the generator 202 because of the ability to remotely measure impedance, a feature not possible in the art. Remote impedance measurements look at impedance at a location physically remote from the first sensor 214 (or the calibration point), for instance at a location some physical distance along the first transmission medium 208 from the first sensor 214 (e.g., at an input of the match network 204).

Inaccuracies in traditional impedance measurements meant that remote monitoring of impedance was difficult if not impossible. There are two reasons that the first sensor 214 overcomes these challenges: (1) the first sensor 214 has a more linear response with respect to increasing voltage standing wave ratio referenced to the calibration impedance than sensors in the art; and (2) the first sensor 214 can more closely measure a phase of the generator 202 output power.

Typically, sensors can be calibrated to operate optimally close to a center operating impedance (e.g., 50Ω), but due to their nonlinear response to impedance variations, as impedance moves away from the calibration impedance, sensor accuracy degrades rapidly. This inaccuracy for physically local measurements is amplified when making measurements over large physical distances. In contrast, sensor 214 has a more linear response on the voltage standing wave ratio circle, which enables accurate impedance measurements at impedances far from the impedance calibration point and therefore at physically remote locations.

In addition, the first sensor 214 can more closely measure a phase of the generator 202 output than could prior generations of sensors. In particular, at high phase angles there is extreme sensitivity to phase angle measurement accuracy, and thus in the resulting impedance and power measurements. Since the first sensor 214 can more accurately measure phase angle, it is better able to remotely measure impedance.

In an embodiment, the first sensor 214 is a directional coupler. A directional coupler can measure the scaled power of forward and reverse power as well as the phase difference between them. The directional coupler can then pass the scaled power and phase difference back to the local controller 212. Scaled power is a voltage that the directional coupler provides to a measurement system that is proportional to an output voltage of the generator 202 operating into its nominal load condition (e.g., 50Ω).

The advantages described above are secondly enabled by unified control and monitoring of the power delivery system 200 through a single local controller 212. The local controller 212 can receive and analyze information from the generator 202, the match network 204, the first sensor 214, and the optional second sensor 218. The local controller 212 may run one or more algorithms to analyze information received regarding the power delivery system 200 and determines procedures to take in order to ensure consistent power delivery to the plasma load 206. The local controller 212 can also issue instructions for other components in the power delivery system 200, such as the generator 202 and match network 204, to carry out certain actions and procedures.

Since the local controller 212 monitors all measurements and distributes all control signals and instructions, many of an operator's responsibilities are alleviated and the speed with which the generator 202 and match network 204 adjust to power and impedance fluctuations is enhanced. Such a configuration also simplifies the hardware requirements of the power delivery system 200 since fewer leads and signal lines are required. By minimizing the number of leads and signal lines, the generator 202 and match network 204 can be controlled via smaller and less complex software and firmware.

Because the local controller 212 manages operation of both the generator 202 and the match network 204, simultaneous tuning of those components is possible. The local controller 212 can instruct an RF engine 213 of the generator 202 to adjust an amplitude, carrier frequency, power frequency, pulse width, pulse duty cycle, or waveform of the generator 202 power output. The local controller 212 can also instruct an impedance control system 215 of the match network 204 to adjust an impedance of the match network 212, for instance by having a motor drive board adjust variable capacitors of the match network 104.

Available tuning options can dictate how the local controller 212 manages the power delivery system 200. Where the generator 202 frequency is fixed, the local controller 212 can pass instructions to the match network 204 to adjust impedance. Where the generator 202 frequency is variable, the local controller 212 can (1) pass instructions to the match network 204 to alter the impedance that the generator 202 sees, (2) pass instructions to the generator 202 to alter the power output frequency, or (3) pass instructions to the match network 204 to alter the impedance that the generator 202 sees and to the generator 202 to alter its power output frequency. Since the generator 202 frequency is more quickly adjusted than the impedance of the match network 204, instructing the generator 202 to tune via frequency in addition to or instead of the match network 204 adjusting impedance, can be preferable where fast tuning is required. In other words, impedance matching can be performed via simultaneous tuning of the generator 202 and the match network 204.

More consistent and accurate power can be delivered when the local controller 212 takes into account information provided by the optional second sensor 218. For instance, the optional second sensor 218 can provide data characterizing the power delivered to the plasma load 206, thus enabling the local controller 212 to more accurately and consistently provide tuning instructions to the generator 202 and the match network 204. Measurements from the optional second sensor 218 can also be used for chamber matching—to improve consistent power delivery between chambers operating in parallel, but each with a different power delivery system. The local controller 212 can also use these measurements to improve wafer to wafer consistency, uniform processing across the wafer surface, end point detection (e.g., via monitoring light emissions from the plasma), and arc management. Although not illustrated, in some embodiments, the optional second sensor 218 can be arranged within the plasma chamber or in contact with the wafer.

In an embodiment, the power provided to the plasma load 206 may be altered for various setpoints (e.g., from a first setpoint to a second setpoint). The match network 204 may not be able to adjust fast enough to maintain consistent power delivery to the plasma load 206 when the generator 202 switches between power setpoints. To overcome this challenge, a test run can be used to determine preferred match network 204 set points corresponding to each generator 202 set point. The test run happens before a device, semiconductor, or any other object to be processed, is placed in the plasma chamber. The match network 204 and generator 202 are then tuned for the various generator 202 set points. Parameters that can be tuned include generator 202 frequency, pulse width, and match network 204 impedance. This tuning is carried out without anything in the chamber so that slow tuning can take place without harming the device in the chamber. Parameters that are determined to be preferred for various generator 202 set points can be stored in a memory. During actual plasma processing, the local controller 212 can issue instructions for the generator 202 and the match network 204 to operate at the preferred parameters associated with the various setpoints. In this way, the match network 204 and generator 202 do not have to tune during processing, but rather can quickly be set to the preferred parameters as determined in the test run.

The local controller 212 can also take into account the following non-limiting aspects characterizing the power delivery system 200: component efficiency characteristics, control algorithm parameters, variable capacitor position in the match network 204, diagnostics such as faults and warnings, component health metrics, component history logs, and component status requests.

The local controller 212 can also take into account non-electrical characteristics of the plasma load 206 when managing operations of the generator 202 and the match network 204. For instance, the local controller 212a can consider chamber pressure, gas chemistry in the chamber, ion energy of the plasma, light intensity of the plasma, spectral content of light emitted by the plasma, and plasma arcing to name a few non-limiting examples. In an embodiment, the optional second sensor 218 can monitor non-electrical characteristics of the plasma load 206 or the plasma processing chamber (not illustrated), such as chamber pressure, gas chemistry in the chamber, ion energy of the plasma, light intensity of the plasma, spectral content of light emitted by the plasma, and plasma arcing, to name a few non-limiting examples.

As illustrated, the local controller 212 is the lone conduit for user interaction with the power delivery system 200. In one embodiment, a user can interface with an external controller 220, which is in communication with the local controller 212. User control of the generator 202 and match network 204 is made via the local controller 212 by way of the external controller 220. However, one of skill in the art will recognize that user interaction with the power delivery system is not necessarily limited to the local controller 212.

The first sensor 214 can optionally be implemented along with an optional second sensor 218 (or load sensor). The optional second sensor 218 can be arranged at an output of the match network 204 (218a) or somewhere between and including the match network 204 and the plasma load 206 (218b). The optional second sensor 218 is configured to characterize the power delivered to the plasma load 206 and can measure voltage, current, phase, impedance, or power at the output of the match network 204 or anywhere between the match network 204 and the plasma load 206. In an embodiment, the optional second sensor 218 can be coupled to the plasma load 206 and can be arranged within the plasma processing chamber or coupled to a wafer during processing.

The local controller 212 can manage communications between the generator 202 (in particular, the RF engine 213), the first sensor 214, the match network 204 (in particular, the impedance control system 215), and the optional second sensor 218, between itself and these components, and between these components and a user (e.g., via the external controller 220). These communications can be made via signal paths 225a or 225b that are internal to the generator 202 and match network 204 respectively, or via signal path 226, which is generally external to the generator 202 and the match network 204 (although can include portions that are internal to the generator 202 and the match network 204).

In the illustrated embodiment, the signal path 226 is a bus (signals can travel in both directions and multiple signals can travel along the same path). However, in other embodiments, various components can have their own signal paths to the local controller 212. In other embodiments, there can be more than one bus-type signal path, and in yet other embodiments there can be a combination of bus-like and non-bus signal paths.

In some embodiments, the signal path 226 can be replaced by communications via the transmission medium 208. In other words, communications from the optional second sensor 218 to the local controller 212 can be modulated on the power signal transmitted between the generator 202 and the match network 204. Communications between the various components illustrated can be via a serial communications protocol such as RS-485. Alternatively, one or more of these communications can be made via a wireless connection or via a wired or wireless network. For instance, the signal path 226 can be implemented as a local area network (LAN).

Referring to FIG. 2b, the local controller 212b is arranged within the power delivery system 200, but is not a part of or connected to the generator 202 or the match network 204. The local controller 212b can communicate with various components via a signal path 226, which is configured as a bus. Again, a bus configuration is not required, and each component can have an isolated signal path to the local controller 212b.

In FIG. 2c, the local controller 212c is coupled to or part of the match network 204. Again any combination of bus-type signal paths or isolated signal paths can be used. As illustrated, the optional second sensor 218 in a first position 218a and the impedance control system 215 communicate with the local controller 212c via signal paths 625b that are internal to the match network 204. The generator 202 (in particular, the RF engine 213), the first sensor 214, and the optional second sensor 218 in alternative position 218b, communicate with the local controller 212c via the signal path 226 in a bus configuration.

The local controller 212, the RF engine 213, the first sensor 214, the impedance control system 215, and the optional second sensor 218 can include any processor, such as, but not limited to, a central processing unit (CPU), a field programmable gate array (FPGA), a programmable logic device (PLD), a digital signal processor (DSP), or a combination of one or more CPU's, FPGA's, PLD's, and/or DSP's. Any of these components can include or be in communication with its own memory or a shared memory where the memory can be configured to store information such as configurations of the generator 202 and the match network 204 or trends in the power delivered to the plasma load 206. The memory can be part of the local controller 212 or can be part of either the generator 202 or the match network 204. In an embodiment, the memory can be a part of the RF engine 213 or the impedance control system 215.

The local controller 212 can include hardware, software, firmware, or a combination of these. For instance, the local controller 212 can include a processor, memory, and software running on the processor that is configured to analyze data from the first and second sensors 214, 218 and determine how and when to instruct the generator 202 and the match network 204 to adjust internal parameters of those components.

The RF engine 213, first sensor 214, impedance control system 215, and the optional second sensor 218 can each include logic such as a processor that receives instructions and transmits information to the local controller 212. Alternatively, the local controller 212 can handle all logic and control functions for each of the RF engine 213, first sensor 214, impedance control system 215, and the optional second sensor 218.

The power delivery requirements can be programmed into the local controller 212, can reside on a memory accessible by the local controller 212, or provided by a user (user power delivery requirements). In an embodiment, the first and second sensors 214, 218 are either V-I sensors (capable of measuring voltage, current, and phase) or directional couplers able to measure phase. In practice only one of the two second sensor 218 positions (218a or 218b) is implemented.

The transmission mediums 208, 210 can be implemented as high power cables or transmission lines. They can also be electrical connections between an adjacent or connected generator 202 and match network 204. In an embodiment, the generator 202 is connected to the match network 204 as part of a unified power delivery system 200 such that the transmission medium 208 is merely an internal electrical connection between two sub components of the power delivery system 200. In another embodiment, the generator 202 and the match network 204 are so interconnected that a transmission medium 208 does not exist. In other words, the generator 202 and match network 204 can be part of a single box, container, package, or unit. Such an embodiment could entail greater integration of sub-components (e.g., power sources, memory, and processors, to name a few) and communications between the generator 202 and the match network 204. Some sub-components within the generator 202 and match network 204 can be shared. For instance, the match network 204 can be made such an integral part of the generator 202 that the generator 202 and the match network 204 can both share a filter and/or final combiner of the generator 202.

In an embodiment, a power control system can include the local controller 212, the first sensor 214, and optionally the second sensor 218. The power control system can be used to modify existing power delivery systems to enhance their power delivery capabilities as discussed above.

Figure 3:
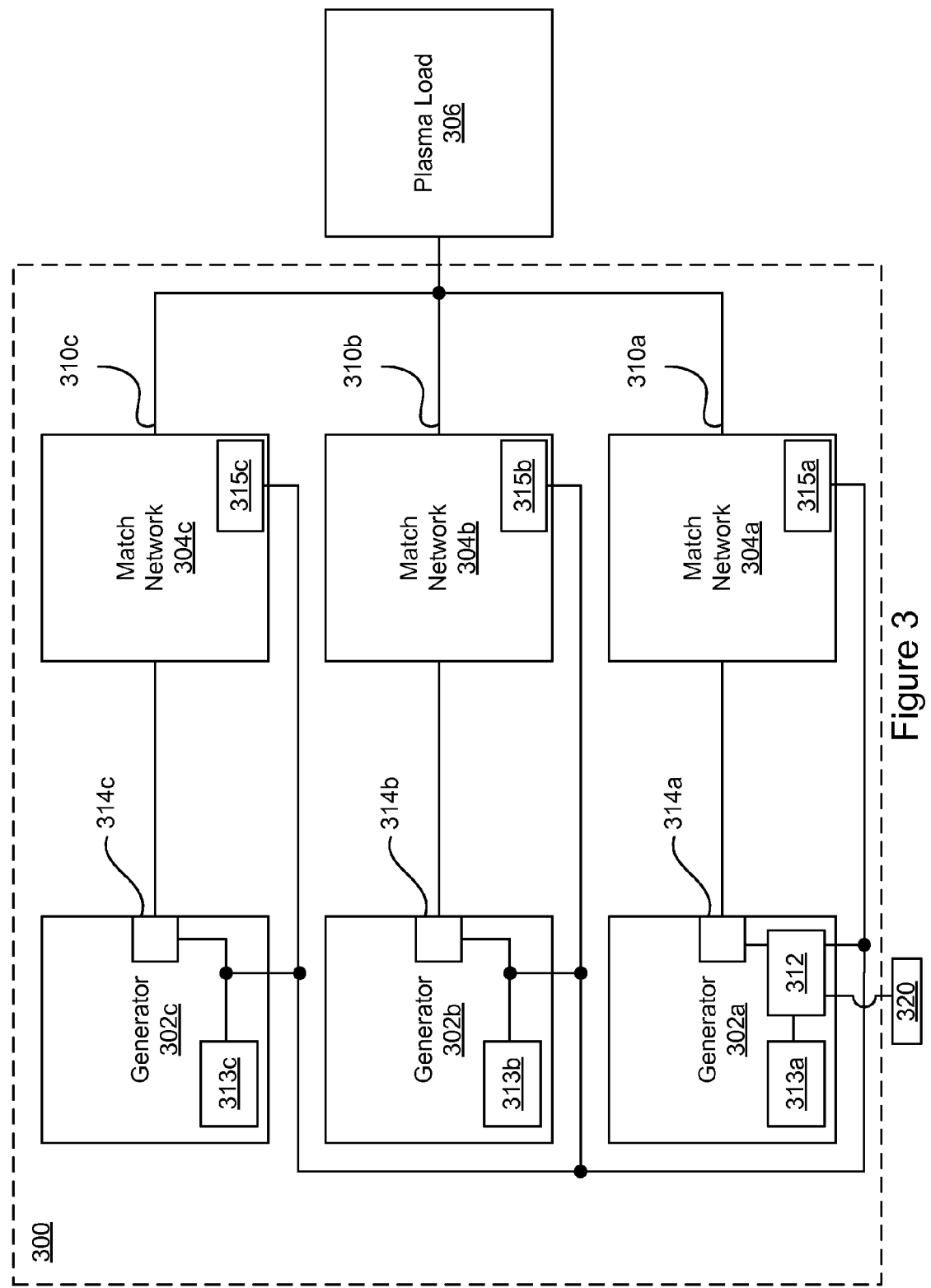
FIG. 3 illustrates an embodiment of a multi-generator power delivery system.

FIG. 3 illustrates an embodiment of a multi-generator power delivery system 300. The power delivery system 300 includes three generators 302a, 302b, 302c each with a match network 304a, 304b, 304c used to minimize reflected power as the generators 302a, 302b, 302c provide power to a plasma load 306. A sensor 314a, 314b, 314c is included for monitoring generator 302a, 302b, 302c voltage, current, phase, impedance, and power. The sensors 314a, 314b, 314c can be part of each generator 302a, 302b, 302c or coupled to each generator 302a, 302b, 302c or external to each generator 302a, 302b, 302c. The sensors 314a, 314b, 314c relay voltage, current, phase, power and impedance measurements to a local controller 312.

The sensors 314a, 314b, 314c can also relay identifications of themselves including information such as configuration and operating parameters to the local controller 312. The generators 302a, 302b, 302c and the match networks 315a, 315b, 315c can also identify themselves to the local controller 312, for instance via the RF engines 313a, 313b, 313c and the impedance control systems 315a, 315b, 315c, respectively.

The local controller 312 can manage communications between the generators 302a, 302b, 302c, the match networks 304a, 304b, 304c, and the sensors 314a, 314b, 314c. The local controller 312 is also configured to pass instructions to the generators 302a, 302b, 302c and the match networks 304a, 304b, 304c regarding how and when to adjust internal parameters. In this way the local controller 312 enables the generators 302a, 302b, 302c and the match networks 304a, 304b, 304c to operate in unison and in a fashion that takes into account variations between components as well as operation of other components. In some instances, this unified operation of the power delivery system 300 can also consider non-electrical factors such as plasma chamber gas chemistry or processing end point. In an embodiment, a frequency of the generators 302a, 302b, 302c can be tuned while also tuning the match networks 304a, 304b, 304c.

In this multi-generator embodiment, a particular challenge in the art is generating consistent power since each generator 302a, 302b, 302c sees the other generators 302a, 302b, 302c through the transmission mediums 310a, 310b, 310c or the plasma load 306 (depending on the configuration). In other words, traditional multi-generator systems are plagued by cross talk interaction between the generators 302a, 302b, 302c. By enabling the generators 302a, 302b, 302c and match networks 304a, 304b, 304c to communicate with each other via the local controller 312 and to be controlled with the local controller 312 taking into account the operation of all of these components simultaneously, consistent and accurate power can be provided to the plasma load 306.

In an embodiment, a user can interface with an external controller 320, which is in communication with the local controller 312. The external controller 320 can send and receive both instructions and data to and from the local controller 412. User control of the generators 302a, 302b, 302c and match networks 304a, 304b, 304c is made via the local controller 312 by way of the external controller 320.

While the local controller 312 is illustrated as being part of generator 302a, it can also be a part of generator 302b or generator 302c. Alternatively, all other locations within the power delivery system 300 can also be used.

Furthermore, the local controller 312 can communicate with an RF engine 313a, 313b, 313c of each generator 302a, 302b, 302c and an impedance control system 315a, 315b, 315c of each match network 304a, 304b, 304c. In particular, the local controller 312 can communicate with and pass instructions to these subcomponents. In this way, the local controller 312 can instruct the generators 302a, 302b, 302c and match networks 304a, 304b, 304c to alter operating parameters such as pulse frequency and variable capacitor position, to name two non-limiting examples.

Figure 4:
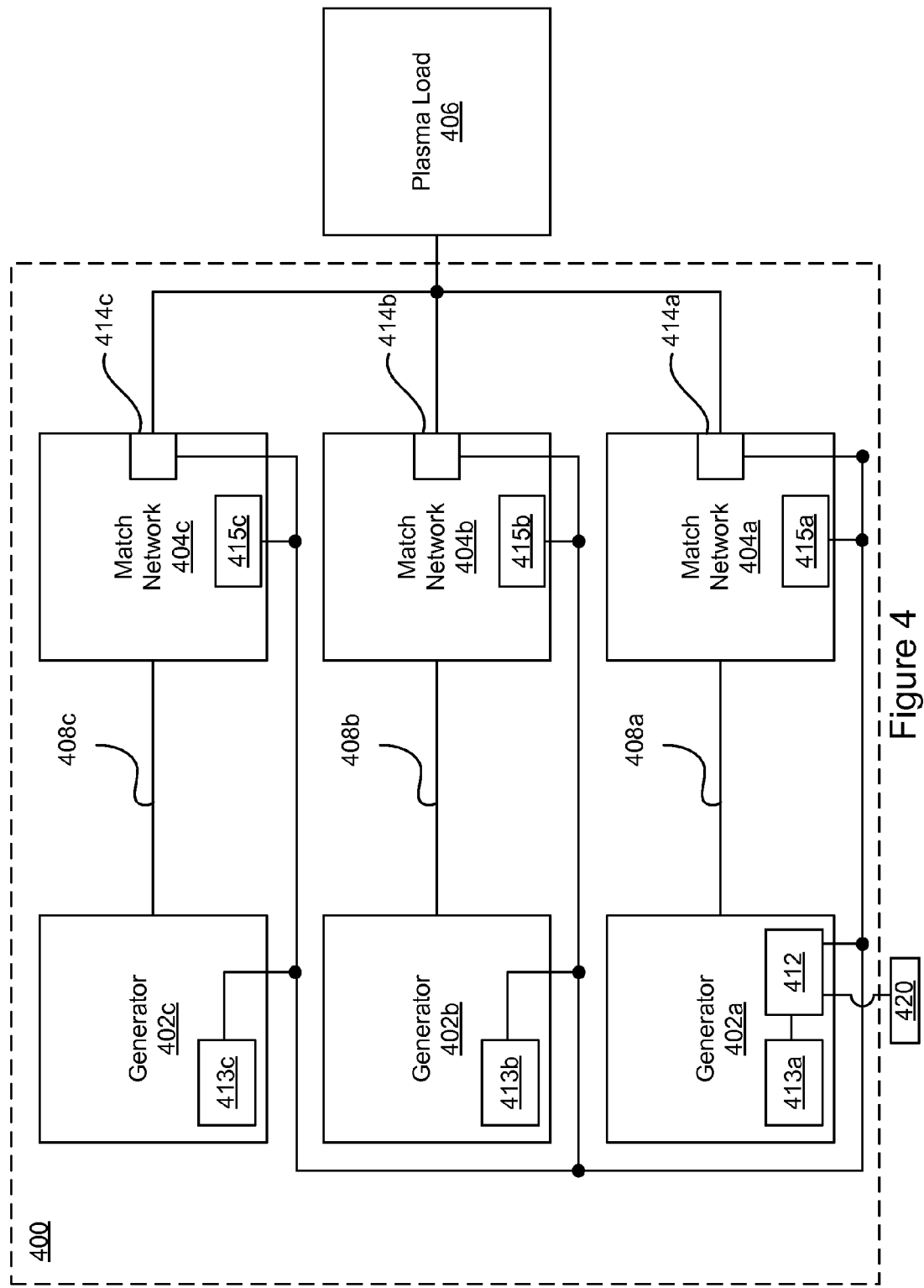
FIG. 4 illustrates another embodiment of a multi-generator power delivery system.

FIG. 4 illustrates another embodiment of a multi-generator power delivery system 400. FIG. 4 differs from FIG. 3 in that the sensors 414a, 414b, 414c are arranged at outputs of the match network 404a, 404b, 404c instead of at outputs of the generators 402a, 402b, 402c. The sensors 414a, 414b, 414c are configured to characterize the power for each generator 402a, 402b, 402c and match network 404a, 404b, 404c by measuring voltage, current, phase, impedance, and/or power at the output of the match networks 404a, 404b, 404c or en route to the plasma load 406.

The sensors 414a, 414b, 414c and the generators 402a, 402b, 402c can identify themselves to the local controller 412 via the RF engines and the impedance control systems 415a, 415b, 415c, respectively.

The power delivery system 400 can interface with users via an external controller 420. The external controller 420 can be in communication with the local controller 412 and send and receive both instructions and data to and from the local controller 412.

As in previous embodiments, the local controller 412 can be arranged as part of the generator 402a, as illustrated, or as part of any of the other components within the power delivery system 400 or adjacent to any of these components, but still within the power delivery system 400.

While impedance control systems 415a, 415b, 415c are illustrated for each match network 404a, 404b, 404c, one of skill in the art will recognize that these can either represent separate hardware (or software or firmware) components, or a single hardware component comprising a separate logical block for each match network 404a, 404b, 404c. In an alternative embodiment, a single impedance control system (not illustrated) may control operating parameters of all three match networks 404a, 404b, 404c.

In another embodiment, the sensors 414a, 414b, 414c can be replaced by a single sensor located between the match networks 404a, 404b, 404c and the plasma load 406. The single sensor can measure voltage, current, phase, impedance, and power just as the three sensors 414a, 414b, 414c illustrated are configured to.

Although the generators 402a, 402b, 402c and the match networks 404a, 404b, 404c are illustrated as communicating with the local controller 412 via the same signal paths (in a bus configuration), in other embodiments, each component may have a separate signal path to the local controller. Alternatively, the generators 402a, 402b, 402c may have one signal path to the local controller 412 while the match networks 404a, 404b, 404c have another signal path to the local controller 412. The sensors 414a, 414b, 414c can also have their own signal path to the local controller 412.

Figure 5:
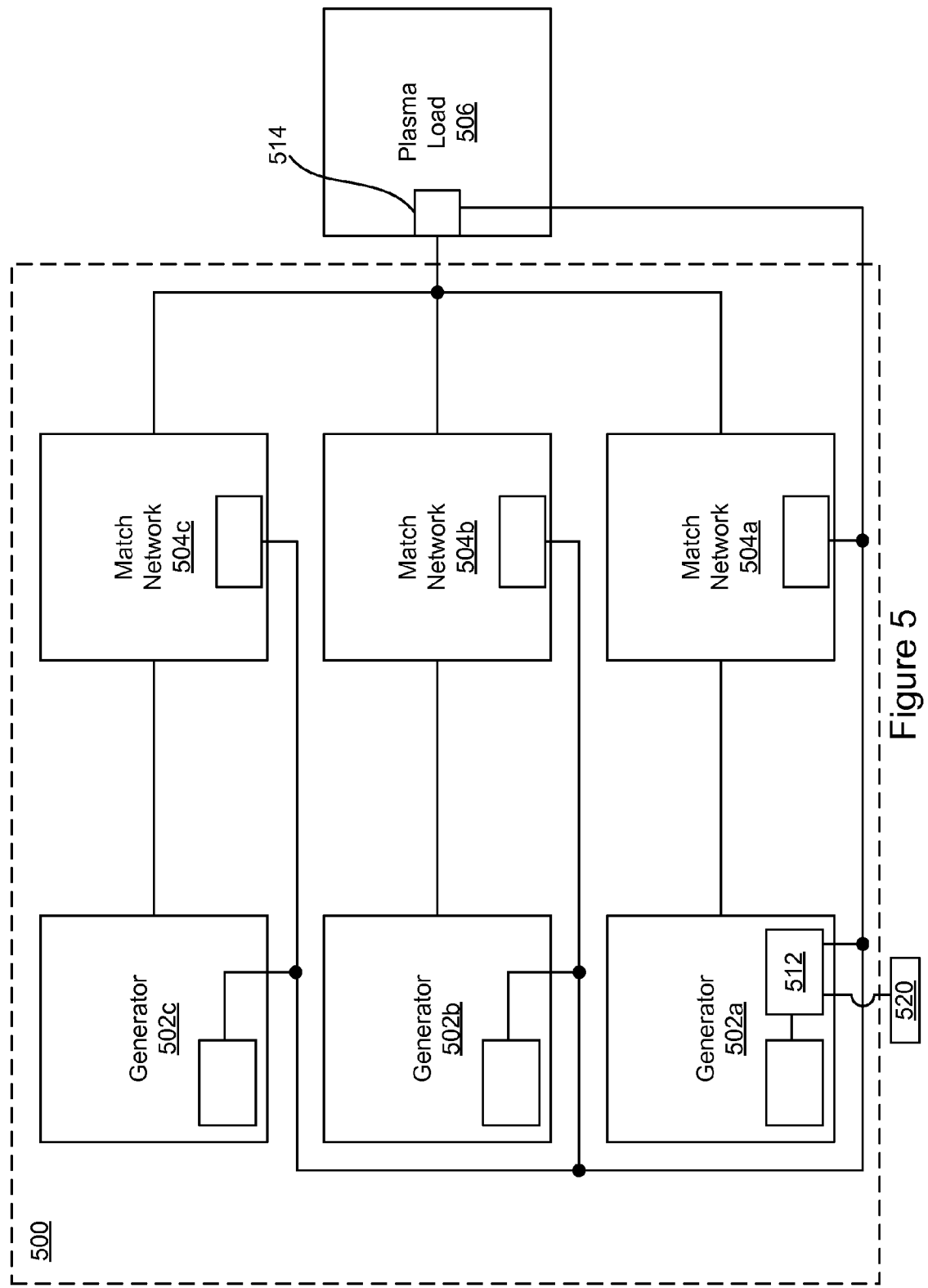
FIG. 5 illustrates yet another embodiment of a multi-generator power delivery system.

FIG. 5 illustrates yet another embodiment of a multi-generator power delivery system 500. FIG. 5 differs from FIGS. 3 and 4 in that the sensors of those figures are replaced here by a single sensor 514 arranged at an input of the plasma load 506. The sensor 514 is configured to characterize the power for each generator 502a, 502b, 502c and match network 504a, 504b, 504c.

The power delivery system 500 can interface with users via an external controller 520. The external controller 520 can be in communication with the local controller 512 and send and receive both instructions and data to and from the local controller 512.

Although the generators 502a, 502b, 502c and the match networks 504a, 504b, 504c are illustrated as communicating with the local controller 512 via the same signal paths (in a bus configuration), in other embodiments, each component may have a separate signal path to the local controller. Alternatively, the generators 502a, 502b, 502c may have one signal path to the local controller 512 while the match networks 504a, 504b, 504c have another signal path to the local controller 512. The sensors 514a, 514b, 514c can also have their own signal path to the local controller 512.

While each external controller of FIGS. 3-5 is illustrated as having its own signal path to the local controller, in alternative embodiments, each external controller can share the same signal path used by the sensor generators, and match networks use to communicate with the local controller.

Although the multi-generator embodiments illustrated in FIGS. 3-5 show three sets of generators, match networks, and sensors, in other embodiments, these configurations can be implemented with two or more sets of generators, match networks, and sensors. In one embodiment, there can be a single sensor rather than a sensor for each set of generators and match networks. The single sensor could measure power output locally for one generator and remotely for two generators. The single sensor could also remotely characterize impedance for all three match networks.

Figure 6:
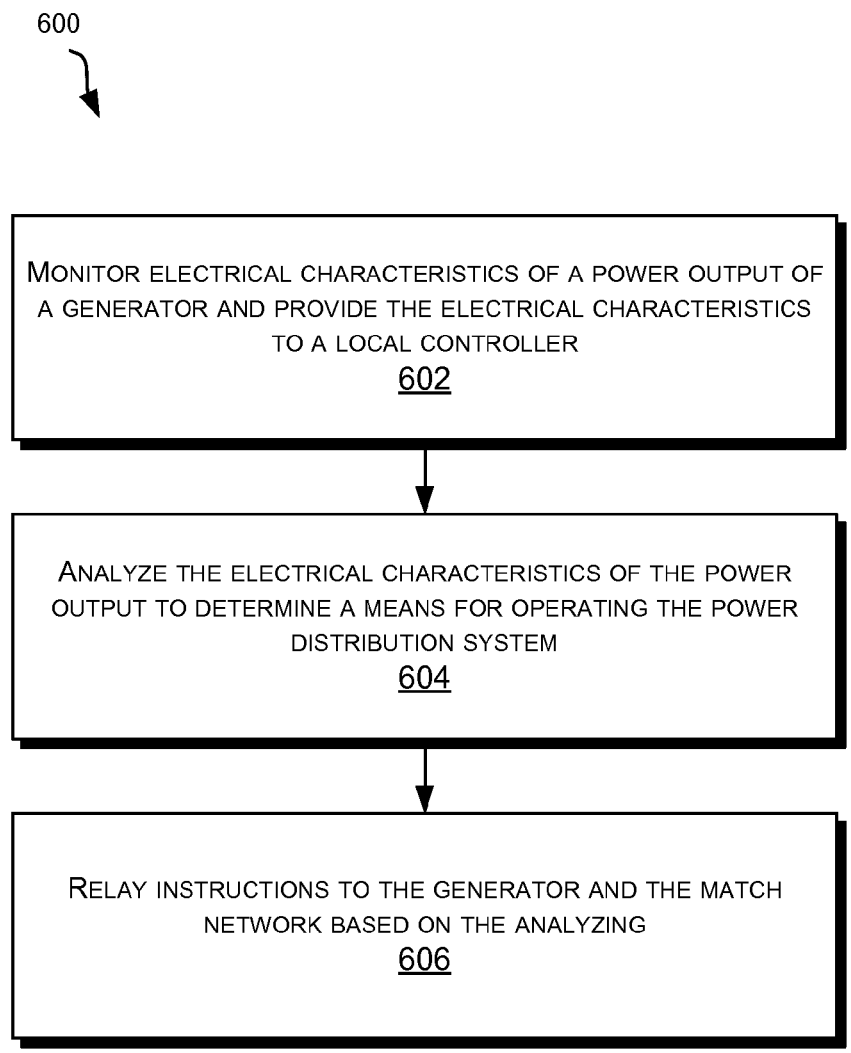
FIG. 6 illustrates a method of supplying power to a plasma load according to one embodiment of this disclosure.

FIG. 6 illustrates a method 600 of supplying power to a plasma load according to one embodiment of this disclosure. The method 600 includes a monitoring operation 602, an analyzing operation 604, and a relaying operation 606. The monitoring operation 602 involves monitoring electrical characteristics of a power output of a generator (e.g., 202) and providing the electrical characteristics of the power output to a local controller (e.g., 212). The analyzing operation 604 can include analyzing electrical characteristics of the power output (e.g., voltage, current, phase, impedance, power). The analyzing operation 604 can also involve determining how the power delivery system (e.g., 200) can be operated in order to meet power delivery requirements in light of the monitored electrical characteristics. The relaying operation 606 can involve relaying (passing or transmitting) instructions to the generator and the match network of the power delivery system, where the instructions can be based on the analyzing operation 604. The instructions can enable the simultaneous tuning of the generator and match network.

Figure 7:
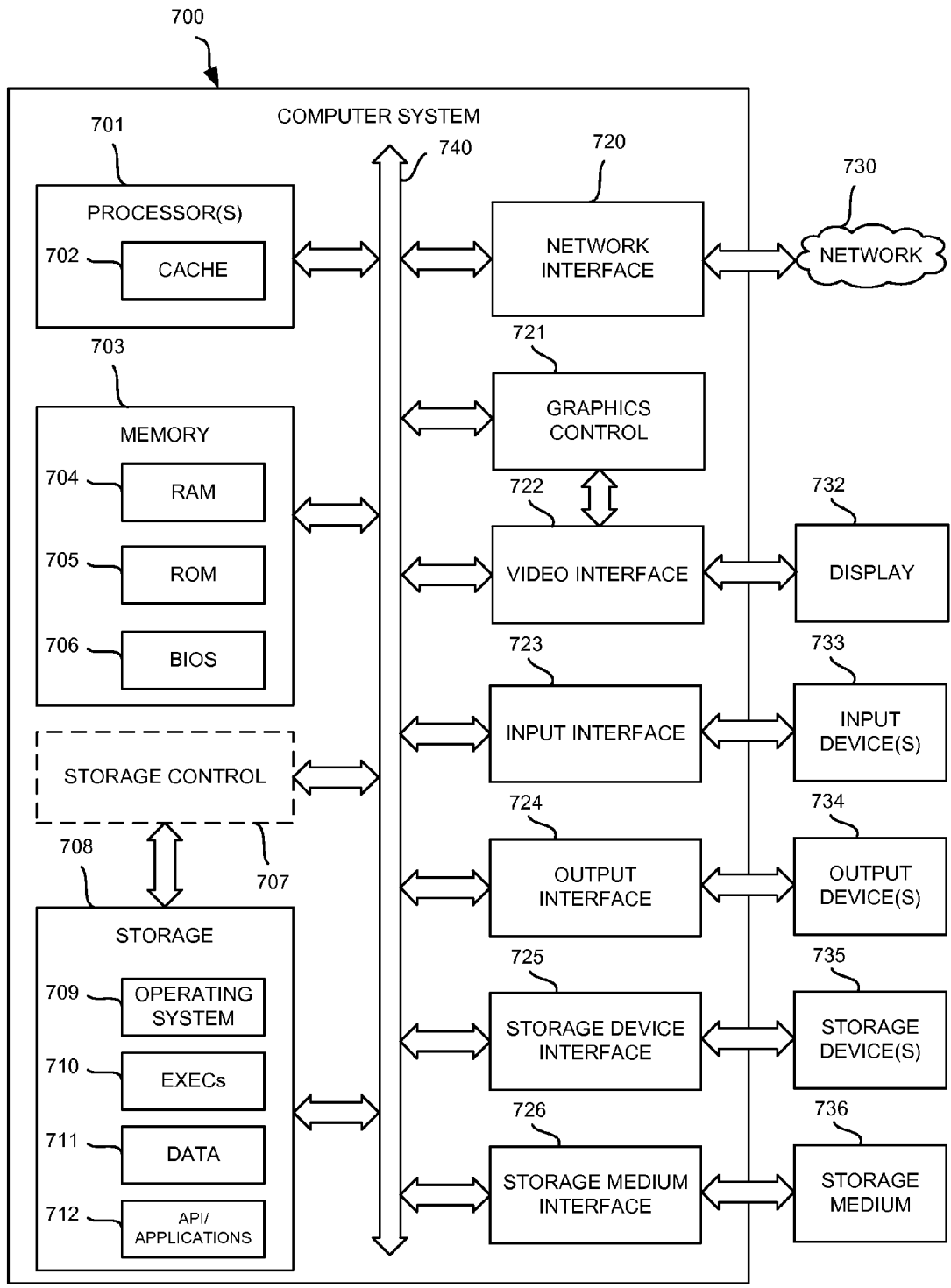
FIG. 7 illustrates an embodiment of a machine according to one embodiment of this disclosure.

The systems and methods described herein can be implemented in a machine such as a computer system in addition to the specific physical devices described herein. FIG. 7 shows a diagrammatic representation of one embodiment of a machine in the exemplary form of a computer system 700 within which a set of instructions can execute for causing a device to perform or execute any one or more of the aspects and/or methodologies of the present disclosure. The components in FIG. 7 are examples only and do not limit the scope of use or functionality of any hardware, software, embedded logic component, or a combination of two or more such components implementing particular embodiments.

Computer system 700 may include a processor 701, a memory 703, and a storage 708 that communicate with each other, and with other components, via a bus 740. The bus 740 may also link a display 732, one or more input devices 733 (which may, for example, include a keypad, a keyboard, a mouse, a stylus, etc.), one or more output devices 734, one or more storage devices 735, and various tangible storage media 736. All of these elements may interface directly or via one or more interfaces or adaptors to the bus 740. For instance, the various tangible storage media 736 can interface with the bus 740 via storage medium interface 726. Computer system 700 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 701 (or central processing unit(s) (CPU(s))) optionally contains a cache memory unit 702 for temporary local storage of instructions, data, or computer addresses. Processor(s) 701 are configured to assist in execution of computer readable instructions. Computer system 700 may provide functionality as a result of the processor(s) 701 executing software embodied in one or more tangible computer-readable storage media, such as memory 703, storage 708, storage devices 735, and/or storage medium 736. The computer-readable media may store software that implements particular embodiments, and processor(s) 701 may execute the software. Memory 703 may read the software from one or more other computer-readable media (such as mass storage device(s) 735, 736) or from one or more other sources through a suitable interface, such as network interface 720. The software may cause processor(s) 701 to carry out one or more processes or one or more steps of one or more processes described or illustrated herein. Carrying out such processes or steps may include defining data structures stored in memory 703 and modifying the data structures as directed by the software.

The memory 703 may include various components (e.g., machine readable media) including, but not limited to, a random access memory component (e.g., RAM 704) (e.g., a static RAM "SRAM", a dynamic RAM "DRAM", etc.), a read-only component (e.g., ROM 705), and any combinations thereof. ROM 705 may act to communicate data and instructions unidirectionally to processor(s) 701, and RAM 704 may act to communicate data and instructions bidirectionally with processor(s) 701. ROM 705 and RAM 704 may include any suitable tangible computer-readable media described below. In one example, a basic input/output system 706 (BIOS), including basic routines that help to transfer information between elements within computer system 700, such as during start-up, may be stored in the memory 703.

Fixed storage 708 is connected bidirectionally to processor(s) 701, optionally through storage control unit 707. Fixed storage 708 provides additional data storage capacity and may also include any suitable tangible computer-readable media described herein. Storage 708 may be used to store operating system 709, EXECs 710 (executables), data 711, APV applications 712 (application programs), and the like. Often, although not always, storage 708 is a secondary storage medium (such as a hard disk) that is slower than primary storage (e.g., memory 703). Storage 708 can also include an optical disk drive, a solid-state memory device (e.g., flash-based systems), or a combination of any of the above. Information in storage 708 may, in appropriate cases, be incorporated as virtual memory in memory 703.

In one example, storage device(s) 735 may be removably interfaced with computer system 700 (e.g., via an external port connector (not shown)) via a storage device interface 725. Particularly, storage device(s) 735 and an associated machine-readable medium may provide nonvolatile and/or volatile storage of machine-readable instructions, data structures, program modules, and/or other data for the computer system 700. In one example, software may reside, completely or partially, within a machine-readable medium on storage device(s) 735. In another example, software may reside, completely or partially, within processor(s) 701.

Bus 740 connects a wide variety of subsystems. Herein, reference to a bus may encompass one or more digital signal lines serving a common function, where appropriate. Bus 740 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 700 may also include an input device 733. In one example, a user of computer system 700 may enter commands and/or other information into computer system 700 via input device(s) 733. Examples of an input device (s) 733 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 733 may be interfaced to bus 740 via any of a variety of input interfaces 723 (e.g., input interface 723) including, but not limited to, serial, parallel, game port, USB, FIREWIRE, THUNDERBOLT, or any combination of the above.

In particular embodiments, when computer system 700 is connected to network 730, computer system 700 may communicate with other devices, specifically mobile devices and enterprise systems, connected to network 730. Communications to and from computer system 700 may be sent through network interface 720. For example, network interface 720 may receive incoming communications (such as requests or responses from other devices) in the form of one or more packets (such as Internet Protocol (IP) packets) from network 730, and computer system 700 may store the incoming communications in memory 703 for processing. Computer system 700 may similarly store outgoing communications (such as requests or responses to other devices) in the form of one or more packets in memory 703 and communicated to network 730 from network interface 720. Processor(s) 701 may access these communication packets stored in memory 703 for processing.

Examples of the network interface 720 include, but are not limited to, a network interface card, a modem, and any combination thereof. Examples of a network 730 or network segment 730 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 730, may employ a wired and/or a wireless mode of communication. In general, any network topology may be used.

Information and data can be displayed through a display 732. Examples of a display 732 include, but are not limited to, a liquid crystal display (LCD), an organic liquid crystal display (OLED), a cathode ray tube (CRT), a plasma display, and any combinations thereof. The display 732 can interface to the processor(s) 701, memory 703, and fixed storage 708, as well as other devices, such as input device(s) 733, via the bus 740. The display 732 is linked to the bus 740 via a video interface 722, and transport of data between the display 732 and the bus 740 can be controlled via the graphics control 721.

In addition to a display 732, computer system 700 may include one or more other peripheral output devices 734 including, but not limited to, an audio speaker, a printer, and any combinations thereof. Such peripheral output devices may be connected to the bus 740 via an output interface 724. Examples of an output interface 724 include, but are not limited to, a serial port, a parallel connection, a USB port, a FIREWIRE port, a THUNDERBOLT port, and any combinations thereof.

In addition or as an alternative, computer system 700 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

In conclusion, the present invention provides, among other things, a system and method for providing consistent and accurate power to a plasma load for plasma processing, especially where the power generation and chamber conditions are dynamic. Some advantages of the systems and methods herein disclosed include: chamber matching, chamber characterization, chamber diagnostics, chamber failure prediction, and troubleshooting, to name a few. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

The invention claimed is:

1. A power delivery system comprising:
   a generator configured to provide power to a plasma load;
   a match network configured to impedance match an output of the generator to the plasma load;
   a first sensor configured to measure at least one of voltage, current, phase, impedance, and power of the power at an output of the generator, and configured to generate a corresponding measured voltage, current, phase, impedance, and/or power; and
   a local controller configured to:
      receive the measured voltage, current, phase, impedance, and/or power from the sensor;
      receive a user power delivery requirement;
      analyze the at least one of measured voltage, current, phase, impedance, and power as well as the user power delivery requirement;
      instruct the generator and/or match network to adjust one or more operating parameters in order to meet the user power delivery requirements; and
      identify the generator, the match network, and the first sensor.

2. The system of claim 1, wherein the one or more operating parameters include a generator frequency or a match network impedance.

3. The system of claim 1, wherein the sensor is configured to measure a power output of the generator and an impedance seen by the generator.

4. The system of claim 1, wherein the local controller is arranged within the generator.

5. The system of claim 1, wherein the local controller is arranged within the match network.

6. The system of claim 1, further comprising a second sensor in communication with the local controller, the second sensor configured to measure a voltage, current, phase, impedance, and/or power between the match network and the plasma load, or non-electrical characteristics of a plasma chamber or non-electrical characteristics the plasma load.

7. The system of claim 1, wherein the local controller is configured to be a lone conduit for user interaction with components of the power delivery system.

8. A method comprising:
monitoring electrical characteristics of a power output of a generator and providing the electrical characteristics of the power output to a local controller;
analyzing the electrical characteristics of the power output;
relaying instructions to the generator and the match network, based on the analyzing, thereby enabling simultaneous tuning of the generator and the match network;
receiving identification of the generator at the local controller;
receiving identification of a match network at the local controller;
analyzing the identifications of the generator and the match network as well as the electrical characteristics of the power output; and
relaying instructions to the generator and match network, based on the analyzing of the operating parameters and the electrical characteristics, enabling simultaneous tuning of the generator and the match network.

9. The method of claim 8, wherein the simultaneous tuning includes tuning a frequency of the generator and an impedance of the match network.

10. The method of claim 8, wherein the identifications of the generator and the match network include a brand, model, or serial number.

11. The method of claim 8, wherein the identifications of the generator and the match network include operating characteristics.

12. A power control system of a power delivery system comprising:
a first sensor configured to monitor power output of a generator and impedance seen by the generator, wherein the generator is configured to provide power to a plasma load via a match network; and
a local controller in communication with the first sensor and configured to: (1) manage tuning of the generator and the match network, where the tuning accounts for the power output of the generator and the impedance seen by the generator; and (2) identify an identity of the first sensor, an identity of the generator, and an identity of the match network.

13. The power control system of claim 12, wherein the local controller is software or firmware configured to operate on a processor and memory of the generator or the match network.

14. The power control system of claim 12, wherein the local controller is a processor having software or firmware operating thereon, and configured for addition to an existing power delivery system.

15. The power control system of claim 12, wherein the tuning accounts for the identity of the first sensor, the identity of the generator, and the identity of the match network.

16. The power control system of claim 12, further comprising a second sensor configured to characterize a power output of the match network and delivered to a plasma load.

17. The power control system of claim 16, wherein the second sensor is configured to monitor characteristics of a plasma chamber, where the plasma is sustained by power delivered from the power delivery system.

18. The power control system of claim 12, wherein the local controller is configured to manage simultaneous tuning of a frequency of the generator and an impedance of the match network.

19. The power control system of claim 12, wherein the local controller interfaces user input and output to and from the first sensor, the generator, and the match network.

20. The power control system of claim 19, wherein the local controller is configured to communicate with an external controller via which a user interfaces with the power delivery system.

21. The power control system of claim 19, wherein the local controller is configured to:
receive user power delivery requirements;
generate instructions for the generator and the match network to achieve the user power delivery requirements; and
pass the instructions to the generator and the match network.

* * * * *